United States Patent
Aoki

(10) Patent No.: US 7,052,980 B2
(45) Date of Patent: May 30, 2006

(54) TRANSISTOR MANUFACTURING METHOD, ELECTROOPTICAL APPARATUS AND ELECTRONIC APPARATUS

(75) Inventor: Takashi Aoki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 200 days.

(21) Appl. No.: 10/804,013

(22) Filed: Mar. 19, 2004

(65) Prior Publication Data
US 2004/0248429 A1    Dec. 9, 2004

(30) Foreign Application Priority Data
Mar. 26, 2003 (JP) .............................. 2003-085757
Dec. 8, 2003 (JP) .............................. 2003-408858

(51) Int. Cl.
*H01L 21/20*    (2006.01)

(52) U.S. Cl. .................. 438/502; 438/151; 438/499

(58) Field of Classification Search ................ 438/151, 438/499, 502
See application file for complete search history.

(56) References Cited

U.S. PATENT DOCUMENTS

| | | | |
|---|---|---|---|
| 6,235,563 B1 * | 5/2001 | Oka et al. | 438/166 |
| 6,514,801 B1 * | 2/2003 | Yudasaka et al. | 438/151 |
| 6,518,087 B1 * | 2/2003 | Furusawa et al. | 438/96 |
| 6,767,775 B1 * | 7/2004 | Yudasaka et al. | 438/156 |
| 6,846,513 B1 * | 1/2005 | Furusawa et al. | 427/248.1 |

FOREIGN PATENT DOCUMENTS

| | | |
|---|---|---|
| JP | A-2001-179167 | 7/2001 |
| JP | A-2002-203794 | 7/2002 |

* cited by examiner

*Primary Examiner*—Christian D. Wilson
(74) *Attorney, Agent, or Firm*—Oliff & Berridge, PLC

(57) ABSTRACT

A method for manufacturing a transistor, includes the steps of preparing a substrate, preparing a liquid material containing a silane compound, the silane compound forming a high order silane when photopolymerized, coating the liquid material on the substrate so as to form a coating film, exposing the coating film to an atmosphere comprising at least one of oxygen and ozone so as to oxidize a surface of the coating film, and performing at least one of thermal processing and photoirradiation processing on the coating film in an inert atmosphere so as to transform the coating film into a silicon layer and a silicon oxide layer disposed on the silicon layer.

24 Claims, 8 Drawing Sheets

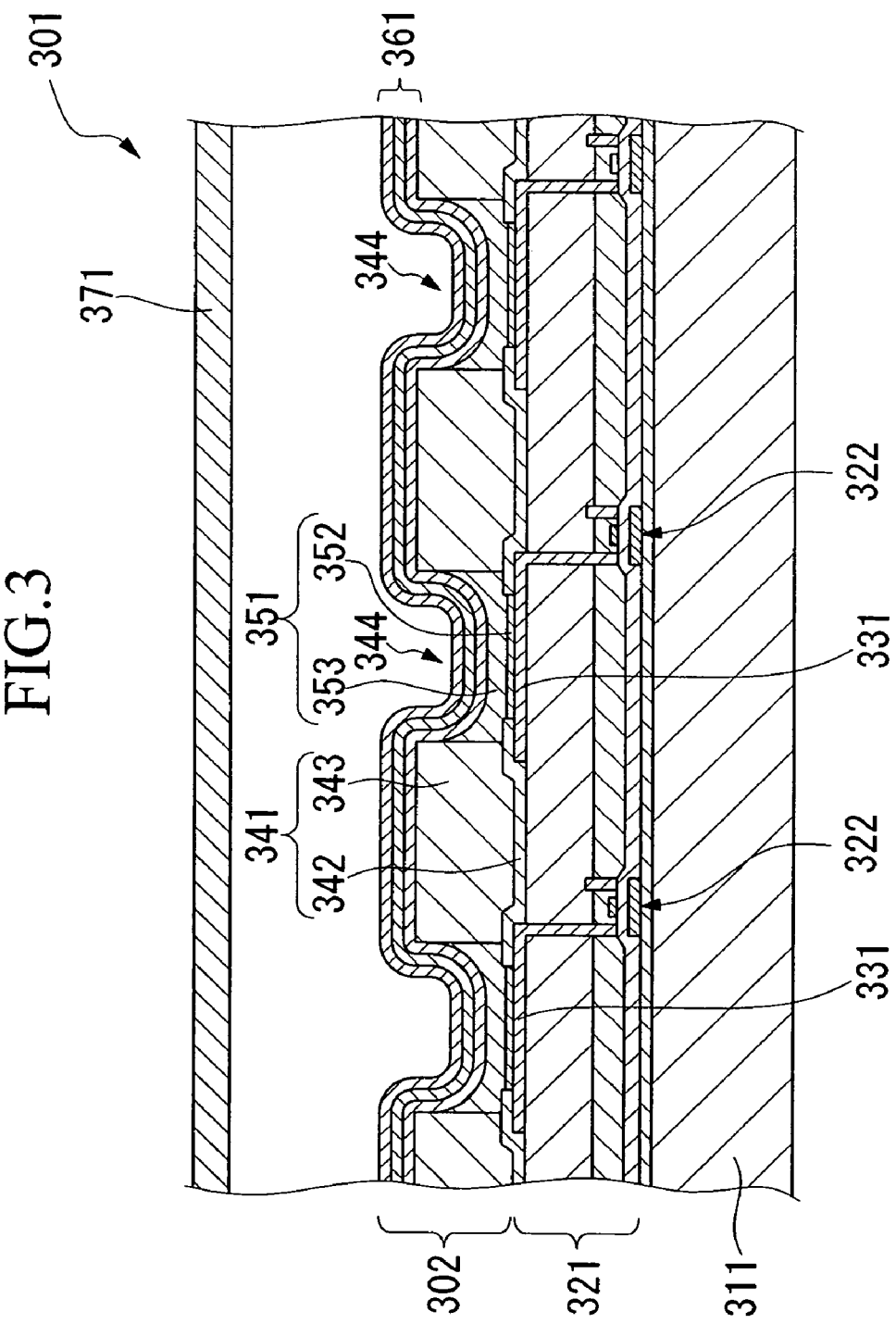

TRANSISTOR MANUFACTURING METHOD, ELECTROOPTICAL APPARATUS AND ELECTRONIC APPARATUS

BACKGROUND OF THE INVENTION

1. Field of the Invention

The present invention relates to a transistor manufacturing method that is appropriately used when manufacturing various types of displays such as organic EL devices and liquid crystal display devices, and also to an electrooptical apparatus and electronic apparatus that are provided with a transistor manufactured using this manufacturing method.

Priority is claimed on Japanese Patent Applications No. 2003-85757, filed Mar. 26, 2003 and No. 2003-408858, filed Dec. 8, 2003, the contents of which are incorporated herein by reference.

2. Description of Related Art

Generally, thin film transistors (TFT) are formed by patterning a thin silicon film and then injecting impurities into this film. A thin silicon film used in such thin film transistors, integrated circuits and the like is normally formed on an entire surface of a substrate by a vacuum process such as a CVD method, and then the thin silicon film is patterned by removing unnecessary portions by photolithography.

However, the following problems are inherent in this film formation and patterning. Namely, (1) a large size apparatus is necessary, (2) the utilization efficiency of the base material is poor, (3) the base material is a gas which creates handling difficulties and (4) a large volume of waste material is generated. In particular, if the size of the substrate is increased, then the apparatus to process this substrate also needs to be enlarged in order to contain the substrate, which further raises the cost of the apparatus.

In contrast to this traditional method, as is shown, for example, in Japanese Unexamined Patent Application, First Publication No. 2002-203794, a method has recently been disclosed in which a silicon layer is formed by coating liquid high order silane or a solution thereof on a substrate, and then applying heat or the like to the silane. According to this type of method, because the base material is a liquid, it is easy to handle, and because no large apparatus is required, a silicon layer can be manufactured at low cost.

A patterning method has also been disclosed in Japanese Unexamined Patent Application, First Publication No. 2001-179167 in which high order silane solution is provided in predetermined positions by a droplet discharge method such as an inkjet method. According to this type of method, it is possible to omit the photolithographic step and to also eliminate waste material, thereby achieving further reductions in cost.

However, thin film transistors are composed not only of a silicon layer, but also have a variety of component elements such as electrodes and gate insulator films. Accordingly, although it is possible to manufacture channel layers using the above described process, other layers still require a conventional high-cost, large size apparatus to be used for their formation. Therefore, currently, a true reduction in cost is yet to be achieved.

In particular, because gate insulator films have a marked effect on the properties of a thin film transistor, conventionally, they have been manufactured using a proven process such as a CVD method or a thermal oxidation method. However, the apparatus used in a CVD method is large and expensive, while a thermal oxidation method requires processing a substrate at a temperature of 1000° C. or more. Therefore, the considerable problem exists that elements formed on the substrate in the process prior to the thermal oxidation process must be elements that are able to withstand extreme temperature processing.

The present invention was conceived in view of the above circumstances and it is an object thereof to provide a method for manufacturing a transistor that achieves a real reduction in cost and increases the level of processing freedom by doing away with processing at high temperature, and that enables a channel layer and a gate insulator film to be manufactured simultaneously using a liquid silicon material, and to provide an electrooptical apparatus and an electronic apparatus that are provided with a transistor obtained using this manufacturing method.

SUMMARY OF THE INVENTION

In order to achieve the above object, the first aspect of the present invention is a method for manufacturing a transistor, has the steps of preparing a substrate, preparing a liquid material containing a silane compound, the silane compound forming a high order silane when photopolymerized, coating the liquid material on the substrate so as to form a coating film, exposing the coating film to an atmosphere comprising at least one of oxygen and ozone so as to oxidize a surface of the coating film, and performing at least one of thermal processing and photoirradiation processing on the coating film in an inert atmosphere so as to transform the coating film into a silicon layer and a silicon oxide layer disposed on the silicon layer.

In addition, the silicon oxide layer may be a gate insulator film of the transistor.

Here, the term "an atmosphere comprising at least one of oxygen and ozone" refers to an atmosphere containing, for example, oxygen or ozone in an inert gas. The term "at least one of oxygen and ozone" means that oxygen by itself is acceptable, ozone by itself is acceptable, or that a mixture of both oxygen and ozone together is acceptable.

According to this transistor manufacturing method, because a liquid material containing a silane compound forming high order silane when photopolymerized by irradiation with ultraviolet light is used as the liquid material, handling is simplified and because it is possible to coat the liquid material on the substrate without a large apparatus being required, the silicon layer can be formed at a low cost.

Moreover, because the coating film is exposed to an atmosphere having oxygen and/or ozone so as to oxidize the surface thereof, and the coating film thereafter undergoes thermal processing and/or photo irradiation processing in an inert atmosphere, the coating film can be formed simultaneously into a silicon layer and an oxidized silicon layer that is formed on the silicon layer. Accordingly, for example, by forming the silicon layer into channel areas and the silicon oxide layer into gate insulator film areas, these can be formed simultaneously in a single simplified process, doing away with the need to perform the formation of a gate insulator film using a CVD method or thermal oxidation method separately from the formation of channel areas, which is how these are formed conventionally. Accordingly, a simplification of the steps and a consequent improvement in productivity can be achieved together with a reduction in costs. Moreover, because processing at a high temperature in excess of 1000° C. is no longer necessary, the degree of processing freedom is increased.

In addition, because the channel areas (silicon layer) can be manufactured totally simultaneously with the gate insulator film (silicon oxide layer), in contrast to a conventional process in which these films are formed separately, excellent boundary interfaces can be obtained. Consequently, an improvement in the characteristics of the transistor that is obtained can be achieved.

Note that by increasing the ozone concentration, it is possible to increase the oxidizability of the atmosphere having oxygen or ozone. By increasing the oxidizability in this manner, the oxidization of the surface of the coating film can be made even more efficient and the processing time thereof can be shortened. In addition, a precise two layer structure formed by an oxidized film and a silicon film that have excellent dielectric properties and interfacial properties can be obtained.

In this method for manufacturing a transistor, in the step of oxidizing a surface of the coating film by exposing the coating film to an atmosphere comprising at least one of oxygen and ozone, ultraviolet light is irradiated on the substrate on which the coating film is formed.

If this method is employed, then when oxygen is present in an atmosphere having oxygen or ozone, by causing this oxygen to react so as to produce ozone, it is possible to increase the ozone concentration in this atmosphere. In addition, as a result of the coating film on the substrate receiving ultraviolet light irradiation, the reaction between the coating film and the oxygen or ozone is accelerated so that the oxidization processing time can be shortened still further. Furthermore, the obtained oxidized film is precisely formed and has excellent dielectric properties and interfacial properties.

Moreover, the second aspect of the present invention is a method for manufacturing a transistor, has the steps of preparing a liquid material containing a silane compound, the silane compound forming a high order silane when photopolymerized, coating the liquid material on the substrate so as to form a coating film, performing at least one of thermal processing and photoirradiation processing on the coating film in an oxidizing atmosphere containing an inert gas, obtained by introducing a predetermined quantity of oxygen or ozone into an inert atmosphere, so as to transform the coating film into a silicon layer and a silicon oxide layer disposed on the silicon layer.

In addition, the silicon oxide layer is a gate insulator film of the transistor.

According to this transistor manufacturing method, because a liquid material containing a silane compound, the silane compound forming high order silane when photopolymerized by irradiation of ultraviolet light is used as the liquid material, handling is simplified and because it is possible to coat the liquid material on the substrate without a large apparatus being required, the silicon layer can be formed at a low cost.

Moreover, because the coating film undergoes thermal processing and/or photo irradiation processing in an oxidizing, inert atmosphere that contains a predetermined quantity of oxygen and/or ozone in an inert atmosphere, the coating film can be formed simultaneously into a silicon layer and an oxidized silicon layer that is formed on the silicon layer. Accordingly, for example, by forming the silicon layer into channel areas and the silicon oxide layer into gate insulator film areas, these can be formed simultaneously in a single simplified process, doing away with the need to perform the formation of a gate insulator film using a CVD method or thermal oxidation method separately from the formation of channel areas, which is how these are formed conventionally. Accordingly, a simplification of the steps and a consequent improvement in productivity can be achieved together with a reduction in costs. Moreover, because processing at a high temperature in excess of 1000° C. is no longer necessary, the degree of processing freedom is increased.

In addition, because the channel areas (silicon layer) can be manufactured totally simultaneously with the gate insulator film (silicon oxide layer), in contrast to a conventional process in which these films are formed separately, excellent boundary interfaces can be obtained. Consequently, an improvement in the characteristics of the transistor that is obtained can be achieved.

Note that by increasing the ozone concentration, it is possible to increase the oxidizability of the atmosphere having oxygen or ozone. By increasing the oxidizability in this manner, the oxidization of the surface of the coating film can be made even more efficient and the processing time thereof can be shortened. In addition, a precise two layer structure formed by an oxidized film and a silicon film that have excellent dielectric properties and interfacial properties can be obtained.

In this transistor manufacturing method, in the step of oxidizing a surface of the coating film by exposing the coating film to the oxidizing atmosphere containing an inert gas, it is preferable that ultraviolet light be irradiated on the substrate on which the coating film is formed.

If this method is employed, then when oxygen is present in an oxidizing, inert atmosphere, by causing this oxygen to react so as to produce ozone, it is possible to increase the ozone concentration in this atmosphere. In addition, as a result of the coating film on the substrate receiving ultraviolet light irradiation, the reaction between the coating film and the oxygen or ozone is accelerated so that the oxidization processing time can be shortened still further. Furthermore, the obtained oxidized film is precisely formed and has excellent dielectric properties and interfacial properties.

In this transistor manufacturing method, the silane compound is photopolymerized into high order silane by irradiating ultraviolet light onto the liquid material, before the liquid material is coated on the substrate.

By photopolymerizing a silane compound into high order silane in this manner, a coating film can be formed in a stable condition.

Note that if an impurity as a dopant source is added to the liquid material after the silane compound has been photopolymerized into high order silane by the irradiation of ultraviolet light, subsequently, channel areas and source and drain areas having excellent electroconductivity can be formed.

In this transistor manufacturing method, it is also possible to use a liquid material containing an impurity as a dopant source, as the liquid material.

If this type of structure is employed, channel areas and source and drain areas having excellent electroconductivity can be formed from this liquid material.

Moreover, in this transistor manufacturing method, it is also possible for the method to include a step of forming a semiconductor layer containing a dopant, as source and drain areas on the substrate, wherein the silicon layer formed from the liquid material is connected with the source and drain areas to form a channel area.

If this type of structure is employed, a more superior transistor can be manufactured.

Moreover, if a liquid material that contains a silane compound, the silane compound forming high order silane when photopolymerized by irradiation of ultraviolet light, and also contains an impurity as a dopant source is used as a material for forming the semiconductor layer, then handling is simplified. In addition, because a coating can be made without a large apparatus being necessary, source and drain electrodes can be manufactured at a low cost.

Furthermore, in this case, if the coating of the material for forming the semiconductor layer on the substrate is discharged using a droplet discharge method, a reduction in cost can be achieved because the photolithographic step can be omitted and waste of material can be avoided.

Moreover, it is preferable in this transistor manufacturing method if a coating of the liquid material on the substrate is made using a droplet discharge method.

If this type of method is employed, a reduction in cost can be achieved because the photolithographic step can be omitted and waste of material can be avoided.

The electrooptical apparatus of the present invention is provided with a transistor obtained by the method for manufacturing a transistor according to the above described manufacturing method.

According to this electrooptical apparatus, because it is provided with a transistor that is low in cost and has improved characteristics, the electrooptical apparatus itself is low in cost and has improved characteristics.

An electronic apparatus of the present invention is provided with the above described electrooptical apparatus.

This electronic apparatus also is low in cost and has improved characteristics.

BRIEF DESCRIPTION OF THE DRAWINGS

FIG. 3 is a side cross-sectional view of an organic EL device.

DETAILED DESCRIPTION OF THE INVENTION

Figure 1:
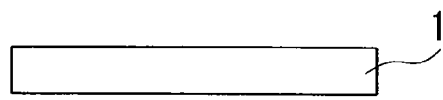
FIGS. 1A to 1G are process explanatory views showing the method of the present invention.
Figure 1:
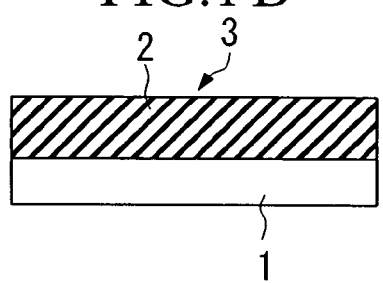
Figure 1:
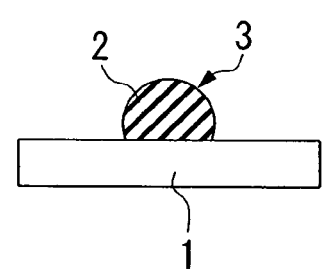
Figure 1:
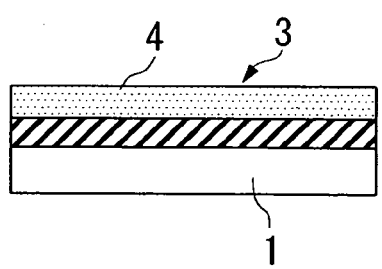
Figure 1:
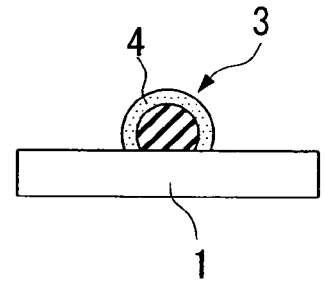
Figure 1:
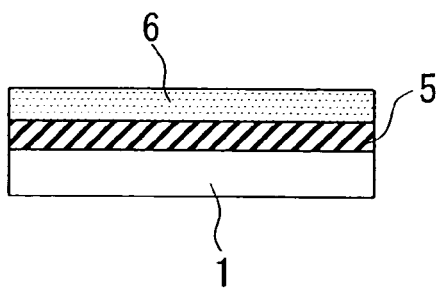
Figure 1:
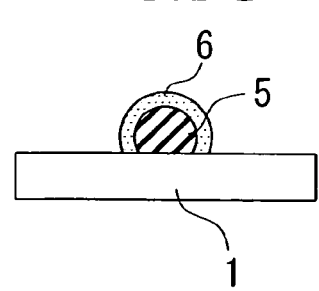

The present invention will now be described in detail.

When manufacturing a transistor provided with a silicon layer and a gate insulator film positioned on top of the silicon layer (for example, a thin film transistor (TFT)), the method for manufacturing a transistor of the present invention uses as the material for forming the silicon layer, in particular, a liquid material containing a silane compound that is changed into high order silane by photopolymerization when irradiated with ultraviolet light. In addition, the method for manufacturing a transistor of the present invention allows a gate insulator film to be manufactured from the same liquid material at the same time.

A specific example of the liquid material that is used is preferably one obtained by irradiating ultraviolet light (may be referred to below as UV) onto a silane compound solution having photopolymerization properties so as to photopolymerize the silane compound into high order silane. This is then used as a liquid containing high order silane serving as a photopolymerization body. This high order silane is formed by irradiating UV onto a solution of the specific silane compound having photopolymerization properties in this manner so that the silane compound is photopolymerized. The molecular weight of such a high order silane is so great (high order silane having a molecular weight as high as approximately 1800 has been confirmed) as to be beyond comparison with high order silane used in conventional silicon layer manufacturing methods (for example, a molecular weight of 182 in the case of $Si_6H_{14}$). In high order silane having such a huge molecular weight, because the boiling point is higher than the decomposition point and it is possible to form a film before the high order silane has evaporated and disappeared, formation of the silicon layer can be performed more effectively than when a conventional silicon layer manufacturing method is used. Note that if this type of high order silane is actually heated, because it decomposes prior to reaching its boiling point, it is not possible experimentally to determine a boiling point higher than the decomposition point. Therefore, here, "boiling point" refers to a boiling point at normal pressure taken as a theoretical value determined by theoretical calculation and the temperature dependency of the vapor pressure.

Moreover, if a liquid containing this type of high order silane is used, because it has the property of the boiling point of the high order silane being higher than the decomposition point thereof, it is not necessary to rapidly heat the liquid at high temperature before it evaporates, as is the case with the conventional process. Namely, the speed at which the temperature is raised can be made more moderate, and a process in which the heating is performed at a comparatively low temperature as the pressure is being decreased becomes possible. This results in it not only being possible to control the coupling speed between silicon elements when a silicon layer is being formed, but by using a process in which a temperature higher than the boiling point of the solvent but not high enough to form a silicon layer is maintained, it is possible to reduce the solvent in the silicon layer, which can be a cause of deterioration of the silicon's properties, more efficiently than when a conventional process is used.

In the transistor manufacturing method of the present invention, if a liquid material containing the above described high order silane is used as a coating material, then a silicon layer can be formed by performing a thermal processing and/or a photo irradiation processing using heat, light, and laser processing or the like after the liquid material has been coated on. Accordingly, as is described below, a thin film transistor can be manufactured easily and at low cost.

It is preferable that the high order silane that is formed by photopolymerization have a boiling point that is higher than the decomposition point thereof, as is described above. This type of high order silane that has a boiling point higher than the decomposition point thereof can be easily obtained by selecting as a precursor silane compound a preferable silane compound described below, selecting UV of the preferable wavelength described below as the irradiated UV, and selecting the irradiation time, irradiation method, irradiation energy, the solvent used, and the refinement process used after the UV irradiation.

Moreover, the molecular weight distribution of this high order silane can be controlled by the UV irradiation time and irradiation amount, and by the irradiation method. Furthermore, by separation and refinement of this high order silane using GPC, which is a typical process for refining a polymer, after the UV irradiation of the silane compound, it is possible to extract a high order silane compound of an optional molecular weight. It is also possible to perform refinement using differences in solubility between high order silane compounds having different molecular weights. It is also possible to perform refinement by fractionation using differences in boiling points at normal pressure or under decompression between high order silane compounds having different molecular weights. By controlling the molecular weights of the high order silane compounds in the liquid material in this manner, it is possible to obtain a high quality silicon layer in which irregularities in the characteristics are further suppressed.

The boiling point of high order silane increases and the solubility thereof in solvent decreases as the molecular weight of the high order silane increases. Accordingly, depending on the UV irradiation conditions, the high order silane may be precipitated after photopolymerization without being completely dissolved in the solvent. Therefore, in this case, the high order silane can be refined by removing impurities by filtration using a microfilter or the like.

The UV irradiated onto the silane compound solution preferably have a wavelength that does not decompose the solvent used in the solution, and, specifically, the wavelength thereof is 250 nm or more and, particularly, 300 nm or more. In the present invention, the term "wavelength that does not decompose the solvent" refers to a wavelength of a range in which chemical couplings between the solvent molecules are not broken by the irradiation of the UV. By using UV of this wavelength range, it is possible to prevent impurity atoms such as carbon atoms originating in the solvent and the like entering into the silicon layer after the thermal processing and/or the photo irradiation processing. Accordingly, a silicon layer having better characteristics can be obtained.

In view of allowing high order silane having a desired molecular weight distribution to be obtained, the UV irradiation time is preferably between 0.1 seconds and 120 minutes, and, particularly preferably, between 1 and 30 minutes.

In addition, in view of allowing high order silane having a desired molecular weight distribution to be obtained, the method used for the UV irradiation is preferably one in which the irradiation is performed after the silane compound has been diluted in the solvent, and UV is irradiated uniformly onto the entire solution while the silane compound solution is being stirred.

Moreover, by adjusting the solvent and the adjustment method for the molecular weight distribution of the high order silane being formed, the viscosity and surface tension of the liquid material containing the silane compound that is a precursor of this type of high order silane can be easily controlled. The greatest merit of this when forming a silicon layer from a liquid is the fact that it is possible to employ a patterning method that uses a droplet discharge method. The fact that it is easy to control the viscosity and surface tension by means of the solvent, as mentioned above, is an extremely useful factor when performing patterning by droplet discharge.

There are no particular restrictions as to the silane compound that forms the precursor of the high order silane provided that it has photopolymerization properties in that it can be polymerized by the irradiation of UV. Examples thereof include silane compounds represented by the general expression $Si_nX_m$ (here, n and m are independent integers of 3 or more, and 4 or more, respectively, and X is a substituent such as hydrogen atoms and/or halogen atoms) and the like.

Examples of the above type of silane compound include all silane compounds having photopolymerization properties to which the photopolymerization process that uses ultraviolet ray irradiation of the present invention can be applied, such as annular silane compounds represented by the general expression $Si_nX_{2n}$ (wherein n is an integer of 3 or more, and X is a hydrogen atom and/or halogen atom), and silane compounds having two or more annular structures represented by the general expression $Si_nX_{2n-2}$ (wherein n is an independent integer of 4 or more, and X is a hydrogen atom and/or halogen atom). Additional examples include silicon hydride having at least one annular structure in a molecule as well as halogen substituents thereof.

Specific examples of such silane compounds having one annular structure include cyclotrisilane, cyclotetrasilane, cyclopentasilane, cyclohexasilane, cycloheptasilane and the like. Examples of silane compounds having two annular structures include 1,1'-bicyclobutasilane, 1,1'-bicyclopentasilane, 1,1'-bicyclohexasilane, 1,1'-bicycloheptasilane, 1,1'-cyclobutasilylcyclopentasilane, 1,1'-cyclobutasilylcyclohexasilane, 1,1'-cyclobutasilylcycloheptasilane, 1,1'-cyclopentasilylcyclohexasilane, 1,1'-cyclopentasilylcycloheptasilane, 1,1'-cyclohexasilylcycloheptasilane, spiro [2, 2] pentasilane, spiro [3, 3] heptasilane, spiro [4, 4] nanosilane, spiro [4, 5] decasilane, spiro [4, 6] undecasilane, spiro [5, 5] undecasilane, spiro [5, 6] undecasilane, and spiro [6, 6] tridecasilane. In addition, silicon compounds in which hydrogen atoms of skeletons of the above compounds have been partially replaced by $SiH_3$ groups and halogen atoms may also be used. These can be used in combinations of two or more.

Among these compounds, silane compounds having an annular structure in a minimum of one location inside the molecule are preferably used as the base material in view of their extremely high reactivity to light and the fact that they can be efficiently photopolymerized. Among such silane compounds, silane compounds represented by $Si_nX_{2n}$ (wherein n is an integer of 3 or more, and X is a hydrogen atom and/or a halogen atom such as a fluorine atom, a chlorine atom, a bromine atom, or an iodine atom) such as cyclotetrasilane, cyclopentasilane, cyclohexasilane, and cycloheptasilane are particularly preferably used as they have the advantage of being easily synthesized and refined in addition to the reasons given above.

Note that, although the above described silane compounds having a ring structure are preferably used as the silane compound, if necessary, it is also possible to use them in combination with silane compounds such as n-pentasilane, n-hexasilane, and n-heptasilane or with modified silane compounds modified using boron atoms, and/or phosphorous atoms or the like provided that the photopolymerization process using ultraviolet irradiation of the present invention is not obstructed.

There are no particular restrictions as to the solvent used in the liquid material of the present invention provided that it is able to dissolve the high order silane formed by the above described silane compound being photopolymerized, and provided that it does not react with this compound. The solvent is used from a stage prior to the UV irradiation as a solvent for forming the solution of the silane compound that forms the precursor of the high order silane, and, normally, a solvent having a vaporization pressure at room temperature of 0.001 to 200 mmHg is used. If the solvent has a vaporization pressure higher than 200 mmHg, the solvent ends up evaporating first when a film is being formed by coating and it is difficult to form a satisfactory film. On the other hand, if the vaporization pressure is lower than 0.001 mmHg, then when a film is being formed by coating drying is delayed and solvent tends to remain in the high order silane coating film. This makes it difficult to obtain a good quality silicon layer after the thermal processing and/or photo irradiation processing that are performed subsequently.

It is also preferable that the solvent used has a boiling point at normal pressure of room temperature or higher and lower than 250° C. to 300° C., which is the decomposition point of high order silane. By using solvent having a boiling point lower than the decomposition point of the high order silane, it is possible after the coating to selectively remove only the solvent by heating without decomposing the high order silane. Accordingly, it is possible to prevent solvent from remaining in the silicon layer and to obtain a higher quality film.

Specific examples of the solvent used in the liquid material, namely, the solvent in the silane compound solution before UV irradiation that becomes the solvent in the high order silane solution after UV irradiation include hydrocarbon based solvents such as n-hexane, n-heptane, n-octane, n-decane, dicyclopentane, benzene, toluene, xylene, durene, indene, tetrahydronaphthalene, decahydronaphthalene, and squalane. Additional examples include ether based solvents such as dipropyl ether, ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, tetrahydrofuran, tetrahydropyran, 1, 2-dimethoxyethane, bis (2-methoxyethyl) ether, and p-dioxane. Further examples include polar solvents such as propylene carbonate, γ-butyrolactone, N-methyl-2-pyrolidone, dimethyl formamide, acetonitrile, and dimethyl sulfoxide.

Among these, in view of their ability to dissolve high order silane as well as the stability of the solution, hydrocarbon based solvents and ether based solvents are preferable, and among these, hydrocarbon based solvents are particularly preferable. These solvents may be used singly or in mixtures of two or more types. Hydrocarbon based solvents are particularly preferable in view of their improved solubility of high order silane, and in view of their ability to suppress high order silane residue during the thermal processing and UV irradiation processing described below.

Before the photopolymerization of the silane compound into high order silane by UV irradiation, it is also possible to add a substance containing impurities as a dopant source, for example, a substance containing an element from group 3B of the periodic table or a substance containing an element from group 5B of the periodic table into the silane compound solution (i.e., the liquid material). If such a liquid material is used, then by irradiating this liquid material with UV it is possible to produce a coupling between the dopant and the high order silane at molecule level. Accordingly, by coating this solution on a substrate and then performing thermal processing and/or photo irradiation processing thereon, a silicon layer having excellent properties and doped into an n-type or p-type can be formed.

If a silicon layer is formed using a high order silane solution to which such a substance has been added, it is difficult for the high order silane to evaporate as it has a high boiling point. As a result, it is possible to suppress evaporation of the dopant source, enabling a dopant to be introduced into a silicon layer more efficiently than when a conventional method is used.

It is possible to achieve a further improvement in the properties of a doped silicon layer formed using such a process by performing a heating step or the like. In particular, by performing the thermal processing and/or the photo irradiation processing described below after coating a high order silane solution formed from a silane compound solution containing such a substance on a substrate, the relevant substance (i.e., the dopant) can be activated.

Note that it is also possible to add the impurity that forms the dopant source into the liquid material after the silane compound has been photopolymerized into high order silane by UV irradiation. Even if this method is employed it is still possible to activate the relevant substance (i.e., the dopant) by performing the thermal processing and/or the photo irradiation processing described below after coating the liquid material (i.e., the high order silane solution) on a substrate.

Examples of the substance containing an element from group 3B of the periodic table or the substance containing an element from group 5B of the periodic table (i.e., as the dopant source) include substances containing elements such as phosphorous (P), boron (B), arsenic (As) or the like, and, specifically, substances such as those disclosed in Japanese Unexamined Patent Application, First Publication No. 2000-31066 may be used.

The high order silane solution (liquid material) used in the manufacturing process of the present invention contains high order silane obtained by a specific process, as described above, as a solute, and is formed by one of the solvents described above. The solute consistency is normally approximately 1 to 80 percent by weight, and can be prepared in accordance with the desired silicon layer thickness. If the solute consistency exceeds 80 percent by weight the high order silane is too easily precipitated and it becomes difficult to obtain a uniform coating film.

The high order silane solution can also be prepared such that the viscosity thereof is normally within a range of 1 to 100 mPa·s. However, the viscosity can be appropriately selected in accordance with the coating apparatus and the coating film thickness.

If the viscosity is less than 1 mPa·s, then coating is difficult, while if the viscosity exceeds 100 mPa·s, a uniform coating film is difficult to obtain.

It is also possible to add, if necessary, minute quantities of a surface tension adjusting agent such as fluorine, silicone, or nonion to the high order silane solution within a range such that they do not interfere with the desired function. The nonion surface tension adjusting agent is useful in improving the wettability of the solution on the object to be coated, improving the leveling of the coated film, and preventing the occurrence of bumps in the coating film and the occurrence of orange peeling.

After the liquid material, namely, the high order silane solution after UV irradiation processing has been prepared, a separate substrate (i.e., a foundation) 1 is prepared, as is shown in FIG. 1A. There are no particular restrictions as to the substrate 1 used here and it may be appropriately selected in accordance with the application of the transistor being manufactured from among normal quartz, boron silicate glass, and soda glass substrates, as well as from metal substrates such as gold, silver, copper, nickel, titanium, aluminum, tungsten and the like, and may also be a plastic substrate. Note that the term "substrate (foundation) 1" used here includes those composed of a glass substrate or the like having various types of component element such as an insulating film formed thereon.

Next, as is shown in FIGS. 1B and 1C, a liquid material 2 is coated onto the substrate 1 to form a coating film 3. Here, the liquid material 2 is the high order silane solution after UV irradiation processing described above. However, the liquid material of the present invention is not limited to this and it is also possible to coat the substrate with the liquid material before UV irradiation processing (i.e., with the silane compound solution), and to subsequently perform UV irradiation processing so as to form high order silane in the solution.

Examples of the method used to coat the substrate with the liquid material 2 include a spin coating method, a roll coating method, a curtain coating method, a dip coating method, a spraying method, and a droplet discharge method. However, it is particularly preferable that a droplet discharge method be used as this allows a reduction in cost to be achieved as the photolithographic step with its inherent wastage can be omitted. Note that in FIG. 1B a coating film 3 formed using a spin coating method or the like is shown, while in FIG. 1C a coating film 3 formed using a droplet discharge method such as an inkjet method or the like is shown.

Here, the number of revolutions of the spinner if a spin coating method is employed can be determined by the thickness of the silicon layer being formed and composition of the coating solution. However, generally, the number of revolutions is between 100 and 5000 rpm and, preferably, between 300 and 3000 rpm.

Figure 2A:
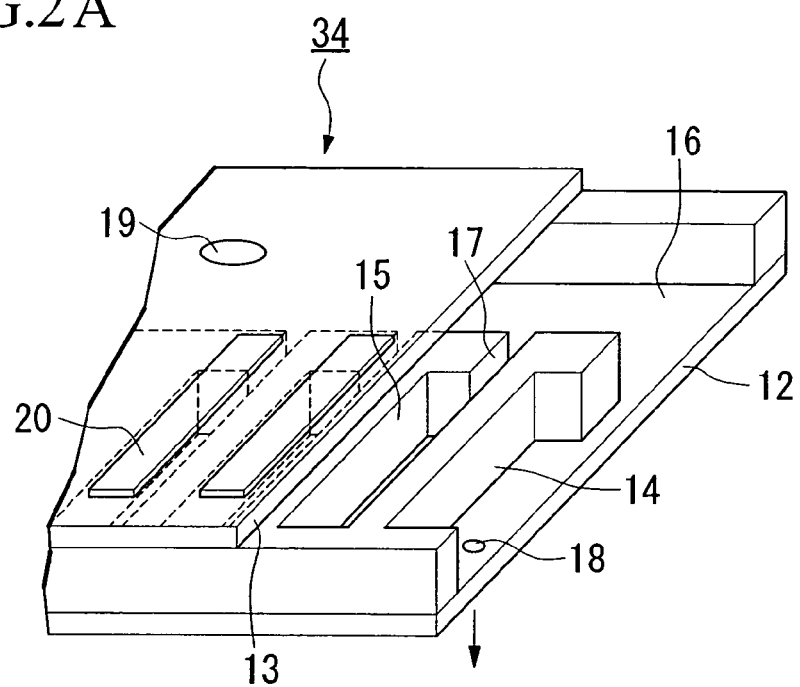
FIGS. 2A and 2B are schematic structural views of a discharge head.
Figure 2B:
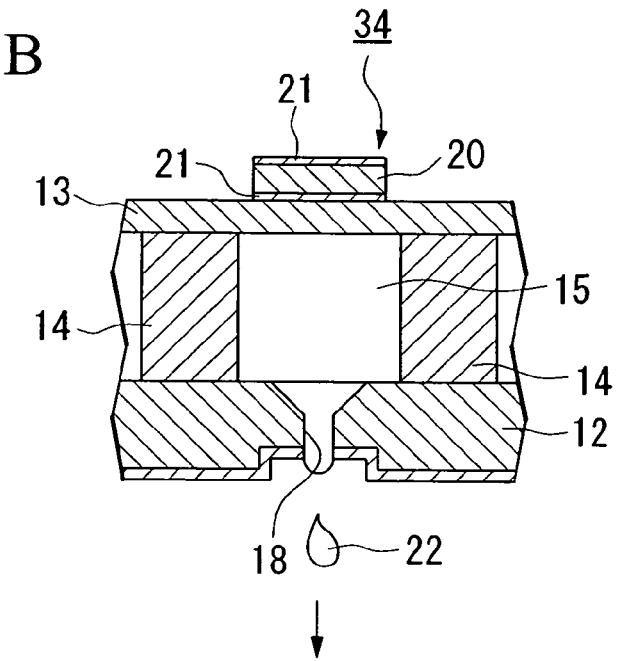

In an inkjet method (i.e., in a droplet discharge method), droplets are discharged using, for example, a droplet discharge head 34 shown in FIGS. 2A and 2B so as to place a desired (minute) quantity of droplets in desired positions. The inkjet method allows the coating film 3 to be formed with a preset size and pattern.

As is shown in FIG. 2A, the droplet discharge head 34 is provided, for example, with a nozzle plate 12 formed from stainless steel and with a diaphragm 13. These two are joined via partitioning members (i.e., reservoir plates) 14. A liquid reservoir 16 and a plurality of spaces 15 formed by the partitioning members 14 are formed between the nozzle plate 12 and the diaphragm 13. The respective spaces 15 and the interior of the liquid reservoir 16 are filled with the liquid material, and the respective spaces 15 are connected to the liquid reservoir 16 via supply ports 17. A plurality of nozzle holes 18 for ejecting liquid material from the spaces 15 are formed in vertical and horizontal rows in the nozzle plate 12. Holes 19 for supplying liquid material to the liquid reservoir 16 are formed in the diaphragm 13.

As is shown in FIG. 2B, piezoelectric elements 20 are bonded to the top of the surface of the diaphragm 13 on the opposite side from the surface thereof that faces the spaces 15. The piezoelectric elements 20 are positioned between a pair of electrodes 20 and are formed such that, when energized, they flex so as to protrude outwards. Based on such a structure, the diaphragm 13 to which the piezoelectric elements 20 are bonded flexes outwards simultaneously and integrally with the piezoelectric elements 20. As a result, the volume of the spaces 15 increases. Accordingly, liquid material corresponding to the size of the volume increase inside the spaces 15 enters via the supply ports 17 into the spaces 15 from the liquid reservoir 16. If the energizing of the piezoelectric elements 20 in this state is terminated, the piezoelectric elements 20 and the diaphragm 13 both return to their original configurations. Accordingly, because the spaces 15 also return to their original volume the pressure of the liquid material inside the spaces 15 is raised and droplets 22 of liquid material are discharged from the nozzle holes 18 towards the substrate.

When coating a substrate with liquid material using a spin coating method or droplet discharge method such as this, normally, in order to prevent the liquid material from becoming oxidized, the oxygen concentration is kept to 10 ppm or less, and the coating is performed in a waterless, inert atmosphere (i.e., an atmosphere such as nitrogen and helium or argon or the like). Note that, if necessary, it is also possible to perform the coating in an atmosphere into which a reducing gas such as hydrogen has been introduced. Moreover, because at temperatures lower than room temperature the solubility of the high order silane is reduced creating the concern that a portion thereof may be precipitated, it is preferable that the operation take place at a temperature above room temperature.

After the coating film 3 has been formed in this manner from the liquid material 2, then, as is shown in FIGS. 1D and 1E, the surface only of the coating film 3 is oxidized to create an oxidized film 4. Here, examples of the method used to selectively oxidize only the surface of the coating film 3 include the following two.

A first method is to expose the coating film 3 to an atmosphere of oxygen or ozone so as to oxidize only the surface thereof.

A second method is to perform thermal processing and/or photo irradiation processing on the coating film 3 in an oxidizing, inert atmosphere that contains a predetermined quantity of oxygen or ozone in an inert atmosphere.

Firstly, the first method will be described. In this method, for example, a predetermined quantity of oxygen and/or ozone is introduced into a chamber containing a substrate 1 on which the coating film 3 has been formed so as to form an oxidizing, inert atmosphere of oxygen or ozone inside the chamber. Next, the coating film 3 is exposed for a predetermined time to the oxidizing, inert atmosphere so that, as is shown in FIGS. 1D and 1E, the surface alone of the coating film 3 is oxidized, and the oxidized film 4 is formed. Here, the term "oxidizing, inert atmosphere of oxygen or ozone" refers to an atmosphere formed by an inert gas such as nitrogen to which oxygen or ozone has been added. The term "oxygen or ozone" means that oxygen by itself is acceptable, ozone by itself is acceptable, or that a mixture of both oxygen and ozone together is acceptable.

Note that the thickness of the oxidized film 4 that is formed can be arbitrarily controlled by controlling the oxygen concentration (or the ozone concentration) and the exposure time. Namely, in the example shown in FIG. 1D, if the substrate surface area is taken as S, if the film thickness of the oxidized film 4 being formed is taken as t, if the density of the oxidized film 4 is taken as $\rho(\approx 2 \text{ g/cm}^3)$, and if the introduced gas is taken as oxygen, then the molecular weight of the $SiO_2$ is 60 and the volume of 1 mol of oxygen at normal temperature and normal pressure (i.e., 24° C. and 1 atmosphere) is 22.4 liters. Therefore, by causing $(S \times t \times \rho/60 \times 22.4)$ liters of oxygen to be completely absorbed in the liquid silicon material, a film having the thickness t after baking can be produced.

For example, if a 100 nm oxidized film is to be formed on a four inch wafer, then 580 µl of oxygen is necessary. Therefore, the interior of a chamber having, for example, a one liter volume is set to 580 ppm, and a substrate is left for a sufficient amount of time inside this chamber. As a result, an oxidized film having a thickness of exactly 100 nm can be produced.

It is also possible for ozone to be used as the introduced gas. In this case, using, for example, a commercially available ozone generator, a predetermined quantity of ozone can then be supplied to the interior of the chamber. Note that it is also possible to introduce both oxygen and ozone into the interior of the chamber, and to form an oxidizing, inert atmosphere with these in a mixed state. In this case, by increasing the ozone concentration, it is possible to increase the oxidizability of the oxidized, inert atmosphere. By increasing the oxidizability in this manner, the oxidization of the surface of the coating film 3 can be made even more efficient and the processing time thereof can be shortened. In addition, a precise oxidized film 4 having excellent dielectric properties and interfacial properties can be formed.

In this first method, after the oxidized film 4 has been formed in this manner, by once again placing the substrate 1 inside an inert atmosphere and then performing thermal processing and/or photo irradiation processing, then, as is shown in FIGS. 1F and 1G, the coating film 3 is formed into a silicon layer 5 and a silicon oxide layer 6 formed on the silicon layer 5.

Notre that in the step to expose the coating film 3 to the oxidizing, inert atmosphere and oxidize only the surface of the coating film 3, it is also possible to irradiate UV for the substrate 1 (i.e., the foundation) on which the coating film 3 has been formed. By irradiating UV in this manner, if any oxygen is remaining in the oxidizing, inert atmosphere, this oxygen is made to react and create ozone. Accordingly, the ozone concentration in the atmosphere is raised enabling the oxidizability thereof to be increased. By also irradiating UV onto the coating film 3 on the substrate 1, the reaction between the coating film 3 and the oxygen and/or ozone is hastened enabling the oxidization processing time to be shortened. Furthermore, a precise oxidized film 4 having excellent dielectric properties and interfacial properties can be formed.

In contrast, in the second method, if, for example, in the first method a predetermined quantity of oxygen or ozone is introduced into the chamber containing the substrate 1 so as to create an oxidizing, insert atmosphere inside this chamber, then by performing thermal processing and/or photo irradiation processing, the coating film 3 is transformed into a silicon layer 5 and a silicon oxide layer 6 formed on the silicon layer 5, as is shown in FIGS. 1F and 1G without there being any lengthy exposure in this state. Note that, in this step as well, by irradiating ultraviolet rays onto the coating film 3 on the substrate (i.e., foundation) 1, as described above, ozone is created from oxygen and the reaction between the coating film 3 and the oxygen and/or ozone is hastened.

Here, a description will be given of the transformation of the coating film 3, namely, of the high order silane into the silicon layer 5 and the silicon oxide layer 6 by thermal processing and/or photo irradiation processing.

The silicon layer 5 obtained by the above described process has an amorphous configuration or a polycrystalline configuration. Particularly when performing thermal processing, generally, when the end-point temperature is approximately 550° C. or less, a silicon layer 5 having an amorphous configuration is obtained. When the end-point temperature is greater than that a silicon layer 5 having a polycrystalline configuration is obtained. Accordingly, if an amorphous silicon layer 5 is desired, the thermal processing is preferably performed at between 300° C. and 550° C., and more preferably at between 350° C. and 500° C. If the end-point temperature is less than 300° C., thermal decomposition of the high order silane does not progress satisfactorily, and in some cases it may not be possible to form the silicon layer 5 with a sufficient thickness. In contrast, if a polycrystalline silicon layer 5 is desired, then, for example, laser light can be irradiated onto the amorphous silicon layer obtained by the process described above so as to transform it into a polycrystalline silicon layer. The atmosphere for the laser light irradiation is preferably an oxygen-less atmosphere such as an inert gas such as nitrogen, helium, or argon. Alternatively the atmosphere may be one of these inert gases into which a reducing gas such as hydrogen has been introduced.

The photo irradiation processing can be performed on the coating film 3 made up of the high order silane solution in an inert gas atmosphere before and/or after the solvent has been removed therefrom. High order silane that can be dissolved in the solvent is not only changed by the reaction caused by the photo irradiation processing into a strong coating film that is not soluble in a solvent, but by performing thermal processing thereon after or simultaneously with the photo irradiation processing, the high order silane can be converted (i.e., transformed) into a silicon layer having excellent electrooptical characteristics.

The light source used in the photo irradiation processing when the high order silane (i.e., the coating film 3) is being converted into the silicon layer 5 and the silicon oxide layer 6 may be a low voltage or high voltage mercury lamp, a deuterium lamp, or a discharge light using a noble gas such as argon, krypton, or xenon. In addition, a YAG laser, argon laser, carbon dioxide gas laser or an excimer laser such as XeF, XeCl, XeBr, KrF, KrCl, ArF, and ArCl may be used.

The output of these light sources is generally between 10 and 5000 W, however, normally between 100 and 1000 W is sufficient. The wavelength of these light sources is not particularly restricted provided that the high order silane absorbs even a slight amount thereof. However, normally, the wavelength is between 170 nm and 600 nm, and from the viewpoint of absorption efficiency, a wavelength of between 170 nm and 380 nm is particularly preferable. In this case, if light having a wavelength of 300 nm or less is irradiated onto the high order silane solution before the solvent is removed, then, as was described above, the energy of the light causes the inter-atom coupling within the solvent molecules to be broken. Consequently, there is a concern that atoms used in the solvent, for example, carbons in a hydrocarbon based solvent may be contained in the silicon layer. Therefore, it is preferable that the UV irradiation be performed after the solvent has been removed. It is also particularly preferable that laser light be used in view of the efficiency of the conversion into a polycrystalline silicon layer. The temperatures of these photo processings are normally between room temperature and 500° C. and may be appropriately selected in accordance with the semiconductor characteristics of the silicon layer 5 to be obtained.

After the silicon layer 5 and silicon oxide layer 6 have been formed in the above described manner, the silicon layer 5 is formed into channel areas, and also into source and drain areas, and the silicon oxide layer 6 is formed as a gate oxide film. Component elements that are essential for a transistor such as gate electrodes and source and drain electrodes are then manufactured in the conventional manner, resulting in the formation of a thin film transistor.

According to this process for manufacturing a transistor, because the liquid material 2 that is used contains a silane compound that becomes high order silane when photopolymerized by the irradiation of ultraviolet rays, handling is simplified. In addition, because coating can be performed without a large size apparatus being necessary, the silicon layer 5 can be formed at a low cost.

Moreover, in both the first method and the second method, because the coating film 3 can be formed simultaneously into the silicon layer 5 and the silicon oxide layer 6 that is formed on top of the silicon layer 5, by, for example, forming the silicon layer 5 into channel areas and forming the silicon oxide layer 6 into a gate insulator film, these can be formed simultaneously in a single simplified process, doing away with the need to perform the formation of a gate insulator film using a CVD method or thermal oxidation process separately from the formation of channel areas, which is how these are formed conventionally. Accordingly, a simplification of the steps and a consequent improvement in productivity can be achieved together with a reduction in costs. Moreover, because processing at a high temperature in excess of 1000° C. is no longer necessary, the degree of processing freedom is increased.

In addition, because the silicon layer 5 that forms the channel areas and the like can be manufactured totally simultaneously with the silicon oxide layer 6 that forms the gate insulator film, in contrast to a conventional process in which these films are formed separately, excellent boundary interfaces can be obtained. Consequently, an improvement in the characteristics of the transistor that is obtained can be achieved.

Note that a thin film transistor obtained in this manner can be favorably used, for example, as a drive element in an organic EL device (i.e., an organic EL display) and a liquid crystal device (i.e., a liquid crystal display).

FIG. 3 is a side cross-sectional view showing an organic EL device serving as an electrooptical device manufactured by applying the transistor manufacturing process of the present invention. The schematic structure of this organic EL device will now be described.

This organic EL device 301 is formed by connecting wiring of a flexible substrate (not shown) and a drive IC (not shown) to an organic EL element 302 formed by a substrate 311, a circuit element section 321, pixel electrodes 331, bank portions 341, light emitting diodes 351, a cathode 361 (i.e., a counter electrode), and a sealing substrate 371. In the circuit element section 321 active elements 322 formed by TFT are formed on top of the substrate 311, and a plurality of the pixel electrodes 331 are arranged in rows on top of the circuit element section 321. Bank portions 341 are formed in a lattice configuration between each pixel electrode 331, and the light emitting diodes 351 are formed in concave apertures 344 created by the bank portions 341. The cathode 361 is formed on top of the entire top surface of the bank portions 341 and light emitting diodes 351, and the sealing substrate 371 is superposed on top of the cathode 361.

The method for manufacturing the organic EL device 301 that includes the organic EL element includes a bank portion formation step in which the bank portions 341 are formed, a plasma processing step for forming suitable light emitting diodes 351, a light emitting diode formation step in which the light emitting diodes 351 are formed, a counter electrode formation step in which the anode 361 is formed, and a sealing step in which the anode 361 is sealed by placing the sealing substrate 371 on top of the anode 361.

In the light emitting diode formation step, light emitting diodes 351 are formed by forming a positive hole injection layer 352 and a light emitting layer 353 in the concave apertures 344, namely, on top of the pixel electrodes 331. Therefore, the light emitting diode formation step includes a positive hole injection layer formation step and a light emitting layer formation step. The positive hole injection layer formation step has a first injection step in which a first composition of matter (i.e., a liquid) for forming the positive hole injection layer 352 is discharged onto each pixel electrode 331, and a first drying step in which the discharged first composition of matter is dried so as to form the positive hole injection layer 352. The light emitting layer formation step has a second discharge step in which a second composition of matter (i.e., a liquid) for forming the light emitting layer 353 is discharged onto the positive hole injection layer 352, and a second drying step in which the discharged second composition of matter is dried so as to form the light emitting layer 353.

In the manufacturing of the organic device 301, particularly when manufacturing the active elements 322 composed of TFT on the substrate 311, the above described transistor manufacturing process of the present invention is employed.

Accordingly, the organic EL device 301 manufactured using active elements 322 in this way, as described above, is provided with a transistor that is low in cost and has improved characteristics. Accordingly, this organic EL device 301 itself is low in cost and has improved characteristics.

In addition, an electro-optical device such as this organic EL device is employed, for example, as a display unit in an electronic instrument.

Figure 4:
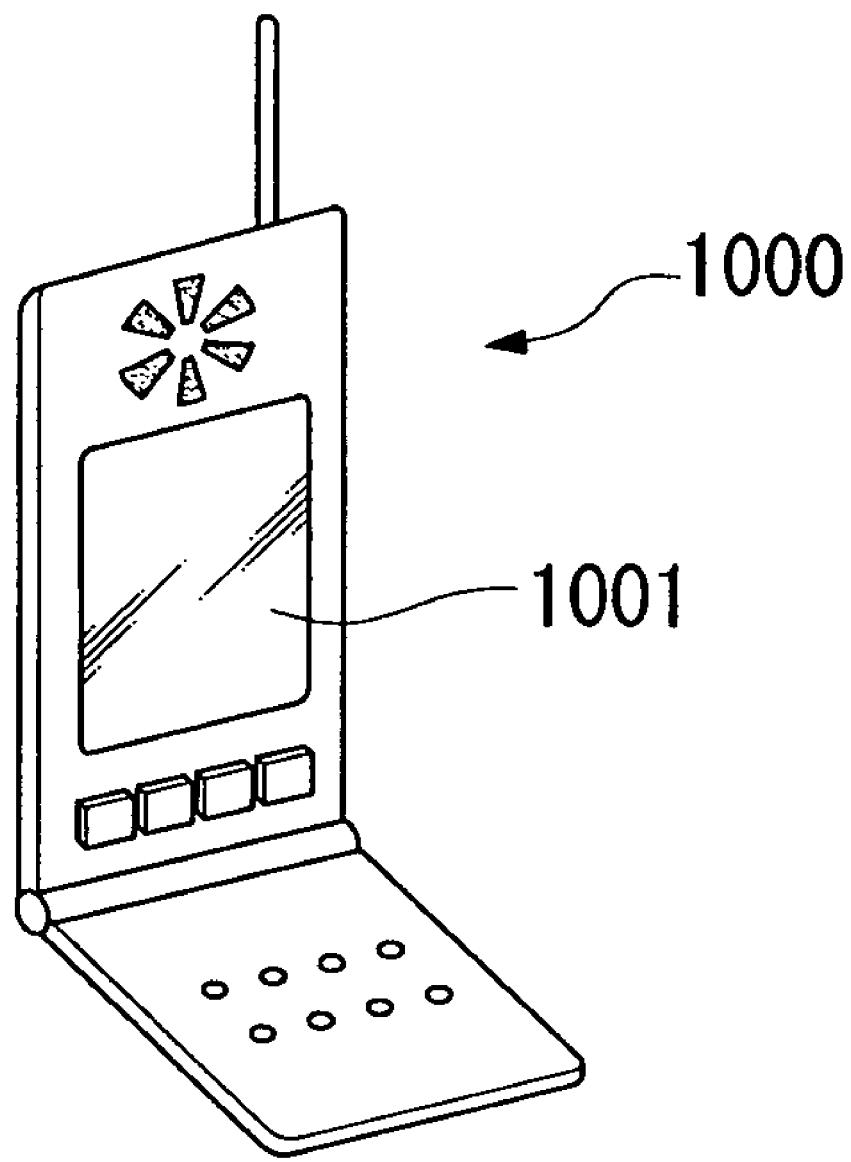
FIG. 4 is a perspective view showing an example of an electronic apparatus.

FIG. 4 is a perspective view showing a mobile telephone serving as an example of this type of electronic instrument. In FIG. 4, the reference numeral 1000 indicates a mobile telephone main body, while the reference numeral 1001 indicates a display unit that uses the above described organic EL device 301.

The electronic apparatus (i.e., mobile telephone) shown in FIG. 4 is provided with the display unit 1001 formed by the organic EL device. Therefore, the electronic instrument can be achieved at a low cost and with improved characteristics, particularly as regards the display unit 1001.

Next, examples in which the transistor manufacturing method of the present invention is implemented experimentally will be described. Note that, in these examples, unless stated otherwise, all processing is performed in an inert atmosphere in which the oxygen concentration is 1 ppm or less.

EXAMPLE 1

30 ml of cyclotetrasilane, which is the silane compound of the present invention, was diluted in 100 ml of hexane.

Next, the resulting silane compound solution (i.e., liquid material) was irradiated with UV from a high pressure mercury lamp at an intensity of 200 mJ/cm$^2$. The cyclotetrasilane was thereby photo polymerized and consequently polymerized (i.e., transformed into high order silane).

Figure 5:
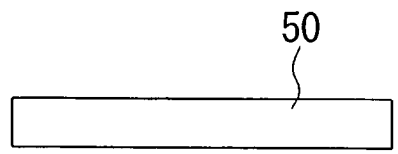
FIGS. 5A to 5D are process explanatory views showing the method of the present invention.
Figure 5:
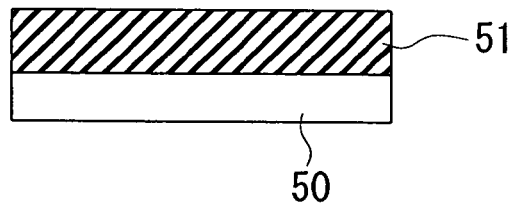
Figure 5:
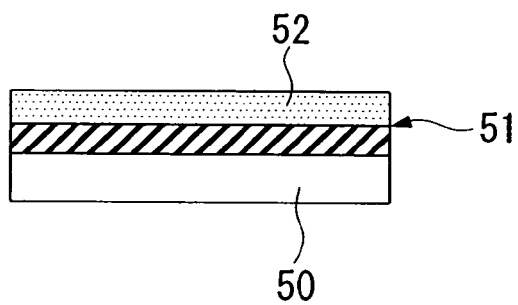
Figure 5:
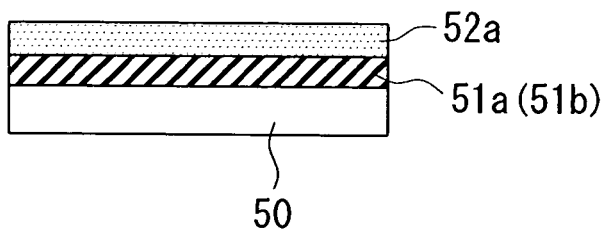

10 ml of this high order silane solution (i.e., liquid material) was then spin coated at 1000 rpm onto a four inch quartz substrate 50 shown in FIG. 5A, so as to prepare a coating film 51, such as that shown in FIG. 5B.

Next, the substrate 50 after the forming of the coating film 51 was placed for 30 minutes inside a chamber in which 500 μl of oxygen was present. Accordingly, as is shown in FIG. 5C, the surface only of the coating film 51 was naturally oxidized so as to form an oxidized film 52.

Next, the substrate 50 was once again placed in a nitrogen atmosphere and the coating film 51 was baked for one hour at a temperature of 500° C.

The thicknesses of the obtained films were measured using an ellipsometer. It was found that, as is shown in FIG. 5D, an SiO$_2$ layer 52a having a thickness of 100 nm was formed on the surface side, while an amorphous silicon layer 51a having a thickness of 150 nm was formed on the substrate 50 side.

EXAMPLE 2

In the same way as in Example 1, as is shown in FIGS. 5A to 5D, a coating film 51 was formed on a substrate 50. The substrate 50 was then left in a chamber in which 1000 µl of oxygen was present for 30 minutes. As a result, the surface only of the coating film 51 was naturally oxidized so as to form an oxidized film 52.

Next, the substrate 50 was once again placed in a nitrogen atmosphere and the coating film 51 was baked for one hour at a temperature of 500° C.

The thicknesses of the obtained films were measured using an ellipsometer. It was found that an $SiO_2$ layer 52*a* having a thickness of 200 nm was formed on the surface side, while an amorphous silicon layer 51*a* having a thickness of 50 nm was formed on the substrate 50 side.

EXAMPLE 3

An excimer laser having a wavelength of 308 nm was irradiated at an energy of 300 mJ/cm$^2$ onto the substrate 50 of Example 1 on which the $SiO_2$ layer 52*a* and the amorphous silicon layer 51*a* were formed. As a result, the surface of the substrate 50 was changed to a transparent, gold-colored thin film.

When the Raman spectrum of the thin film on the substrate 50 was measured sharp peaks were seen at 518 cm$^{-1}$, and it was found that the amorphous silicon layer 51*a* had been transformed into a polysilicon layer.

When the thicknesses of the films were again measured using an ellipsometer, it was found that the films on the substrate 50 comprised an $SiO_2$ layer 52*a* having a thickness of 100 nm and a polysilicon layer 51*a* having a thickness of 150 nm.

EXAMPLE 4

In the same way as for Example 1, a high order silane solution (i.e., liquid material) was coated onto a four inch quartz substrate so as to prepare a coating film.

Next, the substrate after the coating film had been formed thereon was placed for 30 minutes inside a chamber in which an oxidizing, inert atmosphere containing 500 µl of oxygen was present. Next, the substrate was baked at a temperature of 800° C. for five hours with the atmosphere inside the chamber left unchanged.

When the substrate was observed after the baking was completed it was found that a transparent, gold-colored thin film was formed thereon.

When the Raman spectrum of the thin film on the substrate was measured polysilicon peaks were observed, and from this it was found that a polysilicon layer had been formed on the substrate.

When the thicknesses of the obtained films were measured using an ellipsometer, it was found that the films on the substrate comprised an $SiO_2$ layer having a thickness of 100 nm formed on the surface side, and a polysilicon layer having a thickness of 150 nm formed on the substrate side.

EXAMPLE 5

A TFT element was produced using the solution produced in Example 1.

Firstly, a glass substrate was prepared as the substrate 50 shown in FIG. 5A. This substrate 50 was then cleaned by processing the surface of the substrate for three minutes in an ozone cleaning machine. As a result, the wettability of the substrate surface to the liquid material was improved.

Next, 10 ml of the UV irradiated liquid material, namely, of the high order silane solution that was produced in Example 1 was spin coated at 1500 rpm onto the substrate 50 so as to produce a coating film 51, such as that shown in FIG. 5B.

Next, the substrate 50 after the coating film 51 had been formed thereon was placed for 30 minutes inside a chamber in which an oxidizing, inert atmosphere having an oxygen concentration of 2000 ppm was present. As a result, as is shown in FIG. 5C, the surface only of the coating film 51 was naturally oxidized so as to form the oxidized film 52.

Subsequently, the substrate 50 was returned to an inert atmosphere and the coating film 51 was baked for three hours at a temperature of 800° C.

When the thicknesses of the obtained films were measured using an ellipsometer, as is shown in FIG. 5D, it was found that an $SiO_2$ layer 52*a* having a thickness of 100 nm was formed on the surface side to become a gate insulator film, and a polysilicon layer 51*b* having a thickness of 60 nm was formed on the substrate 50 side to become a channel layer.

Figure 6A:
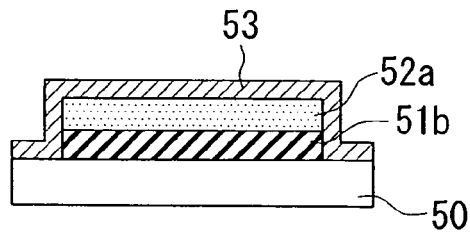
FIGS. 6A to 6E are process explanatory views showing the method of the present invention continuing on from FIG. 5D.

The polysilicon layer 51*b* and the $SiO_2$ layer 52*a* formed thereon in this manner were patterned using known photolithographic technology and etching technology, as is shown in FIG. 6A. Aluminum was then spattered over the entire surface of these superposed films so as to form an electroconductive film 53.

Figure 6B:
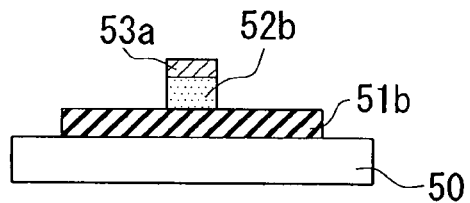

Next, the electroconductive film 53 and the $SiO_2$ layer 52*a* were patterned using known photolithographic technology and etching technology so as to form a gate electrode 53*a* and a gate insulator film 52*b*, as is shown in FIG. 6B.

Figure 6C:
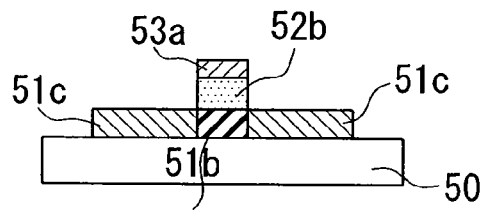

Next, the gate electrode 53*a* thus produced was masked and ion injection was performed. As a result source and drain areas 51*c* were formed in the polysilicon layer 51*b*, as is shown in FIG. 6C.

Next, a polysilazane solution was spin coated on the substrate 50. Subsequently, the substrate 50 was annealed for 30 minutes at a temperature of 450° C. in an inert atmosphere containing 10% oxygen, so as to form an interlayer insulating film over the entire surface of the substrate 50.

Figure 6D:
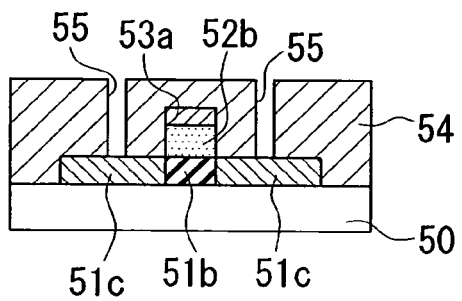

Next, this interlayer insulating film 54 was patterned using known photolithographic technology and etching technology, so as to form contact holes 55 and 55 that pass through the source and drain areas 51*c*, as is shown in FIG. 6D.

Figure 6E:
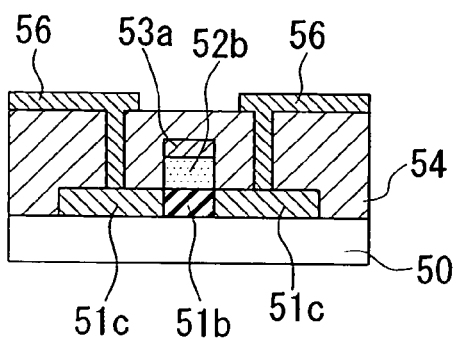

Subsequently, an electroconductive film was formed by once again spattering aluminum over the entire surface of the substrate 50. Next, the source and drain electrodes 56 and 56 were formed, as is shown in FIG. 6E, by patterning using known photolithographic technology and etching technology, so as to form a polysilicon TFT.

When the conduction characteristics of the obtained TFT were measured, the mobility was found to be 160 cm$^2$/Vs.

EXAMPLE 6

A TFT element was produced using the solution produced in Example 1.

Firstly, a glass substrate was prepared as the substrate 50 shown in FIG. 5A. This substrate 50 was then cleaned by processing the surface of the substrate for three minutes in an ozone cleaning machine. As a result, the wettability of the substrate surface to the liquid material was improved.

Next, 10 ml of the UV irradiated liquid material, namely, of the high order silane solution that was produced in Example 1 was spin coated at 1500 rpm onto the substrate 50 so as to produce a coating film 51, as is shown in FIG. 5B.

Next, the substrate 50 after the coating film 51 had been formed thereon was transported to a chamber containing an inert atmosphere. Next, UV having a wavelength of 172 nm was irradiated from outside this chamber at an intensity of 200 mJ/cm$^2$ over the entire surface of the substrate 50 inside the chamber. In addition, oxygen gas was introduced into the chamber so as to form a concentration of 1500 ppm. As a result, ozone was created from a portion of the oxygen by the UV.

Next, while continuing the UV irradiation, the substrate 50 was baked for one hour inside the chamber at a temperature of 800° C.

When the thicknesses of the obtained films were measured using an ellipsometer, as is shown in FIG. 5D, it was found that an SiO$_2$ layer 52a having a thickness of 100 nm was formed on the surface side to become a gate insulator film, and a polysilicon layer 51b having a thickness of 60 nm was formed on the substrate 50 side to become a channel layer.

Using these films, a thin film transistor was produced using the same process as in Example 5. When the conduction characteristics of the obtained TFT were evaluated, the mobility was found to be 190 cm$^2$ Vs, while it was also found that dielectric breakdown voltage was improved.

EXAMPLE 7

A TFT element was produced using an inkjet method (i.e., a droplet discharge method) using the droplet discharge head 34 shown in FIGS. 2A and 2B.

Firstly, 100 mg of decaborane was dissolved in 10 ml of the UV irradiated liquid material, namely, of the high order silane solution produced in Example 1.

Figure 7A:
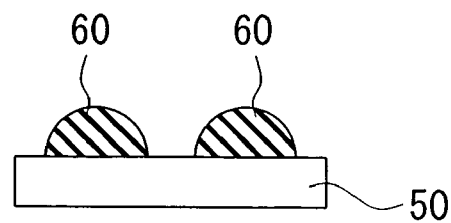
FIGS. 7A to 7D are different process explanatory views showing the method of the present invention.

Next, using an inkjet process, this solution was discharged onto two locations 10 μm apart with each having a quantity of 3 pl on a glass substrate 50, as is shown in FIG. 7A. The reference numerals 60 in FIG. 7A are liquid portions formed by the discharged solution.

Next, the substrate 50 was heated to 50° C. as the pressure was lowered so that hexane, which was the solvent in the liquid portions 60, was removed.

Figure 7B:
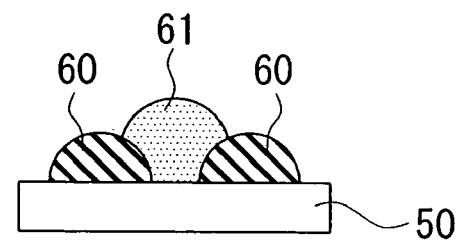

Next, 3 pl of the solution produced in Example 1 (i.e. of the high order silane solution) was discharged using the inkjet method so as to impact between the liquid portions 60 previously discharged, as is shown in FIG. 7B, thereby forming a liquid portion 61.

Next, the substrate 50 was again heated to 50° C. as the pressure was lowered so that hexane, which was the solvent in the liquid portion was removed from the liquid portion 61.

Figure 7C:
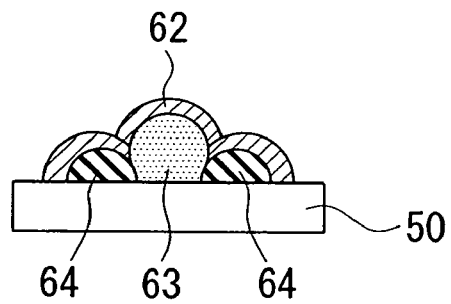

The substrate 50 was then moved to a chamber whose atmosphere had been adjusted to an oxidizing, inert atmosphere having an oxygen concentration of 100 ppm. The substrate 50 was then thermally processed for two hours at a temperature of 400° C. so that the surface alone was oxidized. As a result, as is shown in FIG. 7C, the surface was made into an oxidized film 62, and an amorphous silicon layer 63 and a doped silicon layer 64 were produced. Note that the amorphous silicon layer 63 forms a channel area, while the doped silicon layer 64 forms source and drain areas.

Figure 7D:
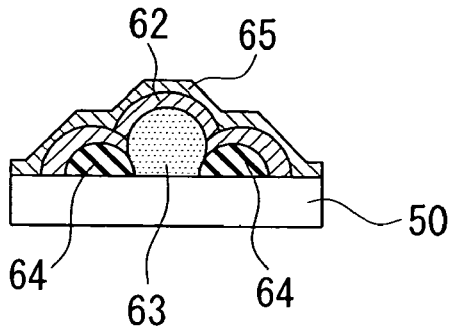
Figure 8A:
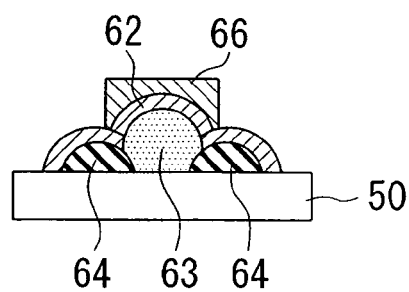
FIGS. 8A to 8D are process explanatory views showing the method of the present invention continuing on from FIG. 7D.

Next, aluminum was spattered over the entire surface of the substrate 50 so that, as is shown in FIG. 7D, an electroconductive film 65 was formed. This electroconductive film 65 was then patterned using photolithographic technology and etching technology so as to produce a gate electrode 66 on top of the amorphous silicon layer 63, as is shown in FIG. 8A. Note that, at this time, it is also possible to directly form a gate electrode pattern without using photo-etching technology by discharging a liquid containing metallic fine particles using an inkjet method and then baking the liquid.

A polysilazane solution was then spin coated onto the substrate 50 and this was then annealed for 30 minutes at 500° C. under atmospheric conditions, so as to form an interlayer insulating film 67 over the entire surface of the substrate 50.

Figure 8B:
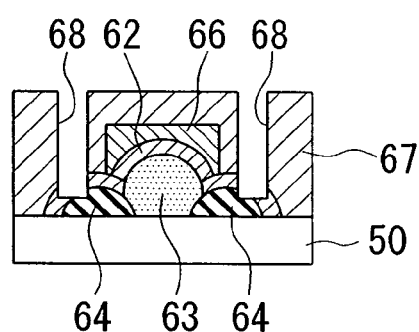

Next, this interlayer insulating film 67 is patterned using photolithographic technology and etching technology (FIG. 8B), and contact holes 68 and 68 are formed that connect with the doped silicon layer 64 (i.e., the source and drain areas).

Figure 8C:
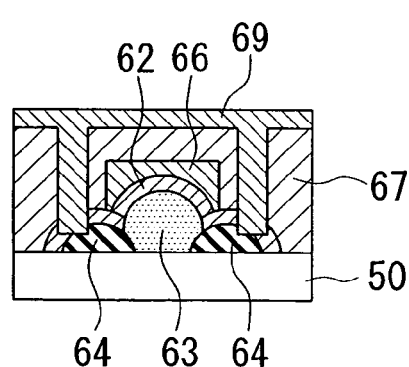
Figure 8D:
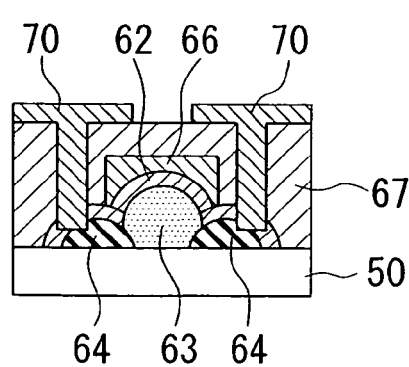

Next, aluminum was again spattered over the entire surface of the substrate 50 so that, as is shown in FIG. 8C, an electroconductive film 69 was formed. This electroconductive film 69 was then patterned using photolithographic technology and etching technology so as to form source and drain electrodes 70 and 70 that connect with the doped silicon layer 64, as is shown in FIG. 8D. As a result, an amorphous silicon TFT was produced.

When the mobility of the obtained TFT was measured it was found to be 5×10$^{-1}$ cm$^2$ Vs.

EXAMPLE 8

A solution obtained by adding 3 mg of phosphorous pentachloride to 10 ml of the solution (i.e., the high order silane solution) of Example 1 was used as the material for forming the channel areas (i.e., the amorphous silicon layer 63) of Example 7. This was discharged using an inkjet method so as to impact between the previously discharged liquid portions 60, as is shown in FIG. 7B, so as to form the liquid portion 61.

The subsequent steps were performed in the same way as in Example 6 so as to produce a PNP type of TFT.

When the mobility of the obtained TFT was measured it was found to be 8×10$^{-1}$ cm$^2$ Vs.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for manufacturing a transistor, comprising the steps of:
   preparing a substrate;
   preparing a liquid material containing a silane compound, the silane compound forming a high order silane when photopolymerized;
   coating the liquid material on the substrate so as to form a coating film;
   exposing the coating film to an atmosphere comprising at least one of oxygen and ozone so as to oxidize a surface of the coating film; and
   performing at least one of thermal processing and photoirradiation processing on the coating film in an inert atmosphere so as to transform the coating film into a silicon layer and a silicon oxide layer disposed on the silicon layer.

2. A method for manufacturing a transistor according to claim 1, wherein the silicon oxide layer is a gate insulator film of the transistor.

3. A method for manufacturing a transistor according to claim 1, wherein in the step of oxidizing a surface of the coating film by exposing the coating film to an atmosphere comprising at least one of oxygen and ozone, ultraviolet light is irradiated on the substrate on which the coating film is formed.

4. A method for manufacturing a transistor according to claim 1, wherein the silane compound is photopolymerized into high order silane by irradiating ultraviolet light onto the liquid material, before the liquid material is coated on the substrate.

5. A method for manufacturing a transistor according to claim 4, wherein an impurity as a dopant source is added to the liquid material after the silane compound has been photopolymerized into high order silane by irradiating ultraviolet light.

6. A method for manufacturing a transistor according to claim 1, wherein the liquid material containing an impurity as a dopant source.

7. A method for manufacturing a transistor according to claim 1, further comprising a step of forming a semiconductor layer containing a dopant, as source and drain areas on the substrate,
wherein the silicon layer formed from the liquid material is connected with the source and drain areas to form a channel area.

8. A method for manufacturing a transistor according to claim 7, wherein a material for forming the semiconductor layer is a liquid material that contains a silane compound, the silane compound forming high order silane when photopolymerized by an irradiation of ultraviolet light, and also contains an impurity as a dopant source.

9. A method for manufacturing a transistor according to claim 8, wherein a coating of the material for forming the semiconductor layer on the substrate is made using a droplet discharge method.

10. A method for manufacturing a transistor according to claim 1, wherein a coating of the liquid material on the substrate is made using a droplet discharge method.

11. An electrooptical apparatus comprising a transistor obtained by the method for manufacturing a transistor according to claim 1.

12. An electronic apparatus comprising the electrooptical apparatus according to claim 11.

13. A method for manufacturing a transistor, comprising the steps of:
preparing a liquid material containing a silane compound, the silane compound forming a high order silane when photopolymerized;
coating the liquid material on the substrate so as to form a coating film;
performing at least one of thermal processing and photoirradiation processing on the coating film in an oxidizing atmosphere containing an inert gas, obtained by introducing a predetermined quantity of oxygen or ozone into an inert atmosphere, so as to transform the coating film into a silicon layer and a silicon oxide layer disposed on the silicon layer.

14. A method for manufacturing a transistor according to claim 13, wherein the silicon oxide layer is a gate insulator film of the transistor.

15. A method for manufacturing a transistor according to claim 13, wherein in the step of oxidizing a surface of the coating film by exposing the coating film to the oxidizing, inert atmosphere, ultraviolet light is irradiated on the substrate on which the coating film is formed.

16. A method for manufacturing a transistor according to claim 13, wherein the silane compound is photopolymerized into high order silane by irradiating ultraviolet light onto the liquid material, before the liquid material is coated on the substrate.

17. A method for manufacturing a transistor according to claim 16, wherein an impurity as a dopant source is added to the liquid material after the silane compound has been photopolymerized into high order silane by irradiating ultraviolet light.

18. A method for manufacturing a transistor according to claim 13, wherein the liquid material containing an impurity as a dopant source.

19. A method for manufacturing a transistor according to claim 13, further comprising a step of forming a semiconductor layer containing a dopant, as source and drain areas on the substrate,
wherein the silicon layer formed from the liquid material is connected with the source and drain areas to form a channel area.

20. A method for manufacturing a transistor according to claim 19, wherein a material for forming the semiconductor layer is a liquid material that contains a silane compound, the silane compound forming high order silane when photopolymerized by an irradiation of ultraviolet light, and also contains an impurity as a dopant source.

21. A method for manufacturing a transistor according to claim 20, wherein a coating of the material for forming the semiconductor layer on the substrate is made using a droplet discharge method.

22. A method for manufacturing a transistor according to claim 13, wherein a coating of the liquid material on the substrate is made using a droplet discharge method.

23. An electrooptical apparatus comprising a transistor obtained by the method for manufacturing a transistor according to claim 13.

24. An electronic apparatus comprising the electrooptical apparatus according to claim 23.

* * * * *